(12) United States Patent
Kessenich

(10) Patent No.: US 7,120,055 B2
(45) Date of Patent: Oct. 10, 2006

(54) FLASH MEMORY DEVICE WITH IMPROVED PROGRAMMING PERFORMANCE

(75) Inventor: Jeffrey Alan Kessenich, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/367,922

(22) Filed: Mar. 3, 2006

(65) Prior Publication Data

US 2006/0146611 A1    Jul. 6, 2006

Related U.S. Application Data

(62) Division of application No. 10/841,785, filed on May 7, 2004, now Pat. No. 7,038,945.

(51) Int. Cl.
G11C 16/04    (2006.01)

(52) U.S. Cl. .............................. 365/185.14; 365/185.28

(58) Field of Classification Search .......... 365/185.14, 365/185.28, 185.22, 185.19
See application file for complete search history.

(56) References Cited

U.S. PATENT DOCUMENTS

| 5,357,463 | A | 10/1994 | Kinney |
| 5,396,459 | A * | 3/1995 | Arakawa ............... 365/185.29 |
| 5,452,251 | A | 9/1995 | Akaogi et al. |
| 5,467,309 | A | 11/1995 | Tanaka et al. |
| 5,528,536 | A * | 6/1996 | Baldi et al. ............ 365/185.18 |
| 5,579,261 | A | 11/1996 | Radjy et al. |
| 5,917,757 | A | 6/1999 | Lee et al. |
| 6,055,186 | A * | 4/2000 | Hung et al. ............ 365/185.18 |
| 6,243,299 | B1 | 6/2001 | Rinerson et al. |
| 6,356,481 | B1 * | 3/2002 | Micheloni et al. ..... 365/185.23 |
| 6,865,119 | B1 | 3/2005 | Becker |
| 6,975,538 | B1 | 12/2005 | Abedifard et al. |
| 2002/0167843 | A1 | 11/2002 | Hsia et al. |
| 2003/0031055 | A1 | 2/2003 | Mihnea et al. |
| 2003/0067818 | A1 | 4/2003 | Hirano |
| 2004/0042270 | A1 | 3/2004 | Huang et al. |

FOREIGN PATENT DOCUMENTS

JP    05182473    7/1993

\* cited by examiner

*Primary Examiner*—Anh Phung
(74) *Attorney, Agent, or Firm*—Leffert Jay & Polglaze, P.A.

(57) ABSTRACT

A selected wordline that is coupled to a cell to be programmed is biased during a program operation. The unselected wordlines are biased with a negative potential to reduce the cell leakage at programming bitline potential. A programming pulse is applied to the bitline coupled to the cell to be programmed. During verification, the unselected wordlines are biased back to ground potential.

20 Claims, 5 Drawing Sheets

FLASH MEMORY DEVICE WITH IMPROVED PROGRAMMING PERFORMANCE

RELATED APPLICATION

This application is a divisional of U.S. patent application Ser. No. 10/841,785 (allowed), filed May 7, 2004,now U.S. Pat. No. 7,038,945, issued on May 2, 2006, and titled, "FLASH MEMORY DEVICE WITH IMPROVED PROGRAMMING PERFORMANCE," which is commonly assigned and incorporated by reference in its entirety herein.

TECHNICAL FIELD OF THE INVENTION

The present invention relates generally to memory devices and in particular the present invention relates to programming operations in flash memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

As electronic systems and software become more complex, they require additional memory capacity. However, as flash memory device sizes increase, the time and power required to program the memory also increases. This can decrease system performance.

NOR-type flash memory devices typically use a Channel Hot Electron (CHE) method of programming. CHE involves a high current on the bitline and through the cell, between the drain and source, that is being programmed. The bitline current also consists of the summed parasitic current from all other cells, on the same bitline, that are intended to be in an "off" state and yet still leak some current. The current leakage increases overall current draw from the bitline charge pump and also increases the voltage drop in the bitline path due to the additional IR drop. This results in lower programming efficiency.

For the reasons stated above, and for other reasons stated below which will become apparent to those skilled in the art upon reading and understanding the present specification, there is a need in the art for more efficient programming of a flash memory transistor.

SUMMARY

The above-mentioned problems with flash memory transistor performance and other problems are addressed by the present invention and will be understood by reading and studying the following specification.

The embodiments of the present invention encompass a method for programming flash memory cells. The flash memory cells are part of a memory array that comprise bitlines coupled to drain connections of the memory cells and wordlines coupled to the control gates of the memory cells.

One embodiment of the method comprises biasing a selected wordline that is coupled to the flash memory cell a first predetermined voltage that may be substantially in the range of 6–12V. The unselected wordlines are biased to a predetermined negative voltage. In one embodiment, the predetermined negative voltage is in the range of −0.1 to −8V. A bitline that is coupled to the flash memory cell is pulsed with a programming pulse. The programming pulse has a second predetermined voltage that may be substantially in the range of 3–6V. If the cell is verified, the unselected wordlines are biased to 0V during the verification process.

Further embodiments of the invention include methods and apparatus of varying scope.

DETAILED DESCRIPTION

Figure 1:
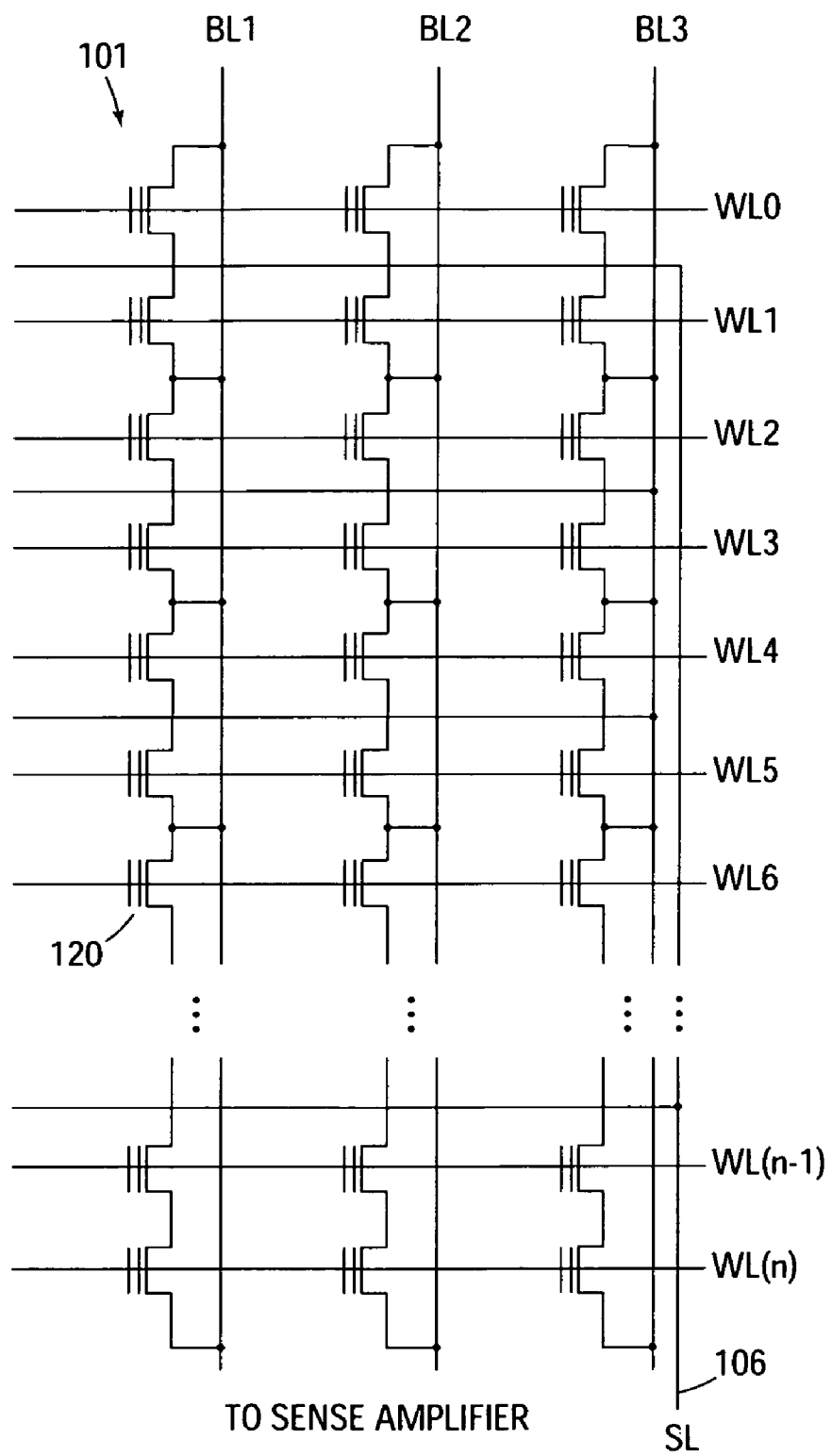
FIG. 1 shows a schematic diagram of one embodiment of a flash memory array of the present invention.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates a typical NOR-type flash memory array of the present invention. The NOR architecture is one of the common types of flash memory array architectures. The memory is comprised of an array 101 of floating gate cells 120. Each cell 120 is comprised of a drain connection, a source connection, and a control gate.

In the NOR array architecture, the floating gate memory cells of the memory array are arranged in a matrix. The control gates of each floating gate memory cell 120 of the array matrix 101 are connected by rows to word select lines (wordlines WL0–WLn) and their drains are connected to column bitlines, BL1–BL3. The source of each floating gate memory cell 120 is typically connected to a common source line SL 106.

The NOR architecture floating gate memory array 101 is accessed by a row decoder activating a row of floating gate memory cells by selecting the wordline connected to their gates. The row of selected memory cells then place their stored data values on the column bitlines by flowing a differing current if in a programmed state or an erased state from the connected source line to the connected column bitlines.

The bitlines are coupled to sense amplifiers in order to read the cells. The desired cells are turned on for programming, as well as reading, in response to a voltage on the wordline. The sense amplifier operation is well known in the art and is not discussed further.

The NOR flash memory of FIG. 1 is for purposes of illustration only. For purposes of clarity, an entire memory array cannot be shown since it is comprised of millions of memory cells.

During a typical prior art programming operation, a voltage in the range of 3–6V is applied to the appropriate bitline. The wordline of the selected row typically has a voltage in the range of 6–12V applied to turn on the appropriate floating gate transistors to be programmed. Unselected wordlines are held at ground potential during the programming operation.

During a typical prior art program verify operation, a voltage in the range of 0.2–1.2V is applied to the bitline. The selected wordline has a voltage in the range of 4–8V applied and the unselected wordlines are again held at ground potential. This couples the selected cells to the sense amplifiers for reading/verifying the programmed status of the cells.

Figure 2:
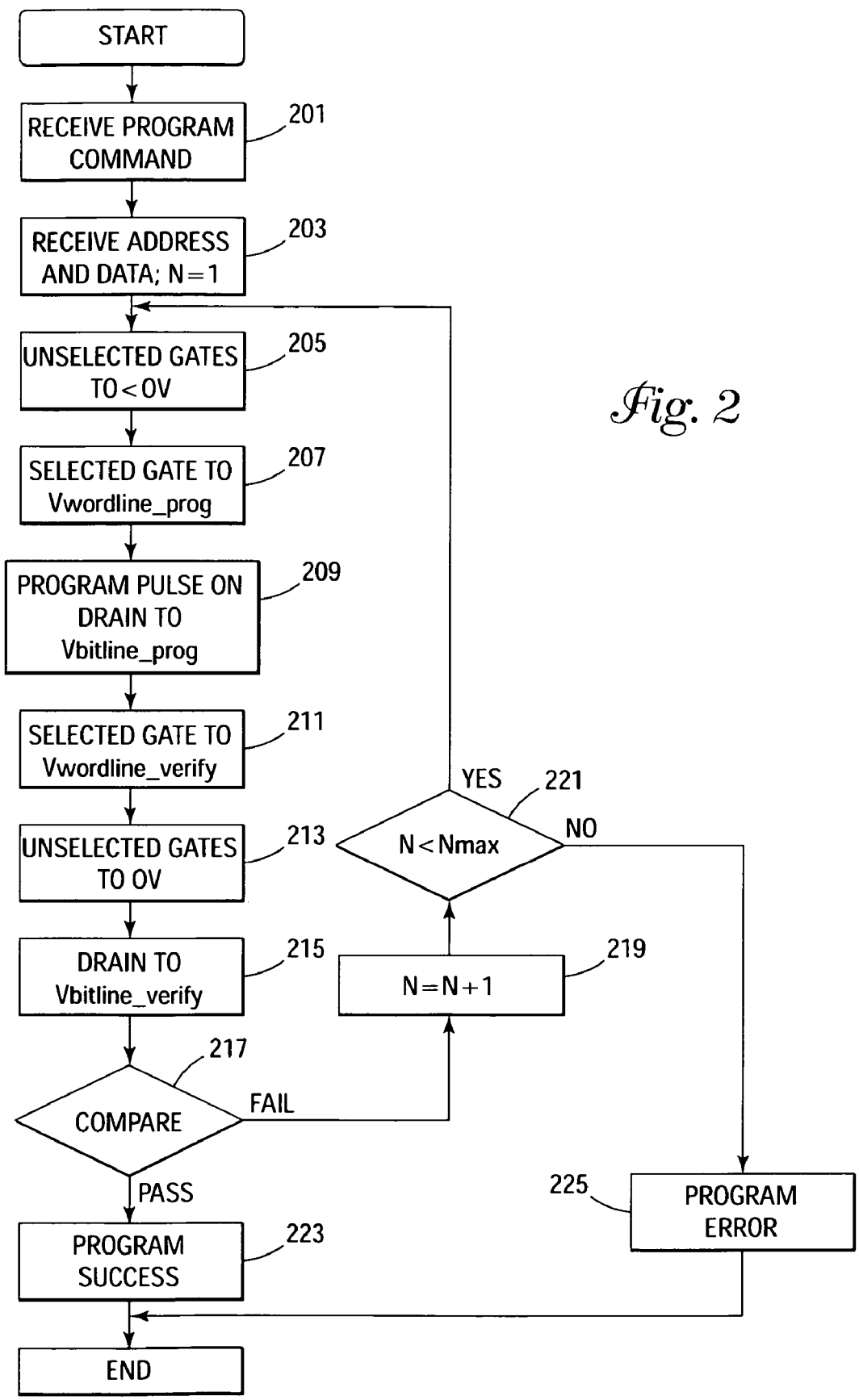
FIG. 2 shows a flowchart of one embodiment for the method of the present invention for efficiently programming a flash memory cell.

The flash cell programming method of the present invention is illustrated in FIG. 2. A program command is received by the memory device 201. The address and data to be programmed are also received 203 and a programming counter is set. In one embodiment, the counter, N, is set to 1.

The unselected gates are biased to a negative voltage 205. The selected gate is biased with the programming voltage 207. In one embodiment, the negative voltage is substantially in the range of −0.1 to −8V and the selected wordline is biased to a programming voltage substantially in the range of 6–12V.

A programming pulse is applied to the bitline of the column containing the cell to be programmed 209. The pulse has a voltage substantially in the range of 3–6V.

The above bias voltages are for purposes of illustration only. The present invention is not limited to any one range of voltages since the voltage ranges may vary depending on the memory cell technology that is used.

Once the programming operation has been completed, a verification operation can be performed to determine that the selected cell or cells have been properly programmed. In this case, the selected wordline is biased by a read voltage 211. In one embodiment, this voltage is substantially in the range of 4–8V. The unselected wordlines are brought back to ground potential 213 while and the bitline is biased at a verify voltage 215 that can be substantially in a range of 0.2–1.2V.

A comparison is performed to verify proper programming 217. If the verification succeeds, the programming has passed 223. If the verification has not succeeded on this pass, the programming counter is incremented 219. The counter is then compared with the maximum quantity of programming attempts to be made 221. If the maximum attempts have been made without success, a program error has occurred 225 and the programming attempt ends. If the maximum number of programming attempts have not been made 221, the method again biases the unselected gates to a negative voltage 205 and the programming/verification method repeats.

The embodiment illustrated in FIG. 2 discusses the programming of one flash memory cell. However, it is well known in the art that the method can be used to program a plurality of memory cells of the memory array. For example, if a plurality of memory cells are coupled to a bitline and the memory cells' control gates are coupled to multiple wordlines, a selected wordline is biased respectively as discussed previously and the bitline receives a program pulse as each memory cell that is coupled to that bitline is programmed and its wordline selected. The remaining unselected wordlines are biased with a negative voltage.

The negative potential on the unselected wordlines during the programming operation reduces the unselected cell leakage current at programming bitline potential. This reduces the current load on the bitline, thus reducing voltage drops in the bitline path and allows higher programming bitline voltage to reach the selected cells to be programmed. The higher programming bitline voltage produces more efficient (i.e., faster) programming of the selected cells.

Figure 3:
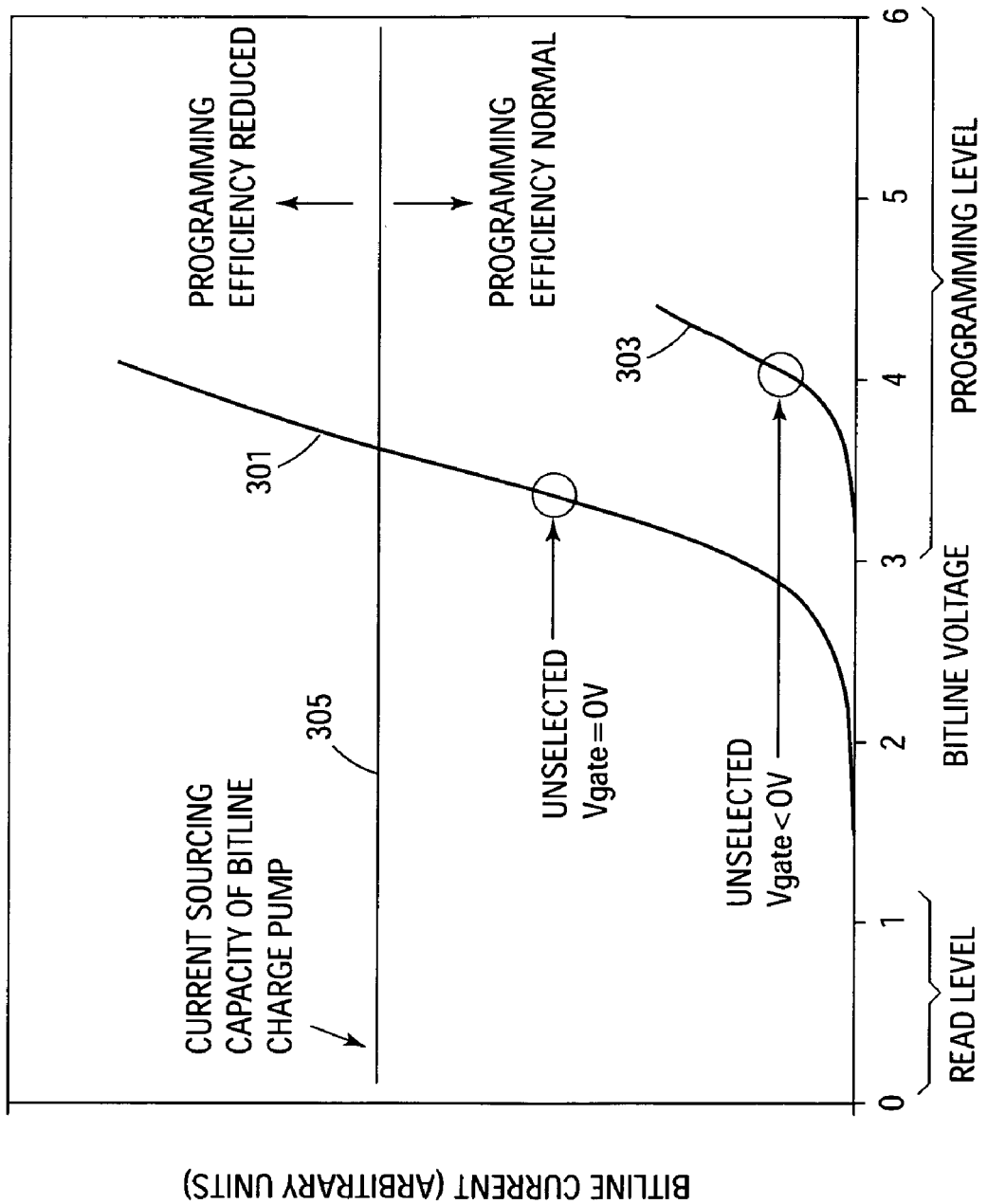
FIG. 3 shows a plot of bitline voltage versus bitline current for prior art read and program operations as compared to the more efficient programming operation of the present invention.

FIG. 3 illustrates a plot of bitline voltage versus bitline current for typical prior art flash memory read and program operations as compared to the more efficient programming operation of the present invention. The y-axis is the bitline current required for a respective bitline voltage used during a read or program operation shown along the x-axis. The units of the bitline current are not relevant to this illustration.

The plot shows that during a read operation, the voltage levels are low and, therefore, the required bitline current levels are also low. The second curve 301 shows the bitline voltage versus current for the typical prior art programming operation where the unselected wordlines are at ground. This curve shows that the bitline current levels increase beyond the current sourcing capability 305 of the bitline charge pump. This not only has the undesirable effect of increasing the power requirements of the memory device but it increases the time required to perform a programming operation, thereby decreasing system performance.

The third curve 303 shows the bitline voltage versus current for the efficient programming operation of the present invention. This curve illustrates that when the unselected wordlines are biased with a negative voltage, the programming efficiency greatly improves and the required bitline current is substantially less than the current sourcing capability of the bitline charge pump 305.

Figure 4:
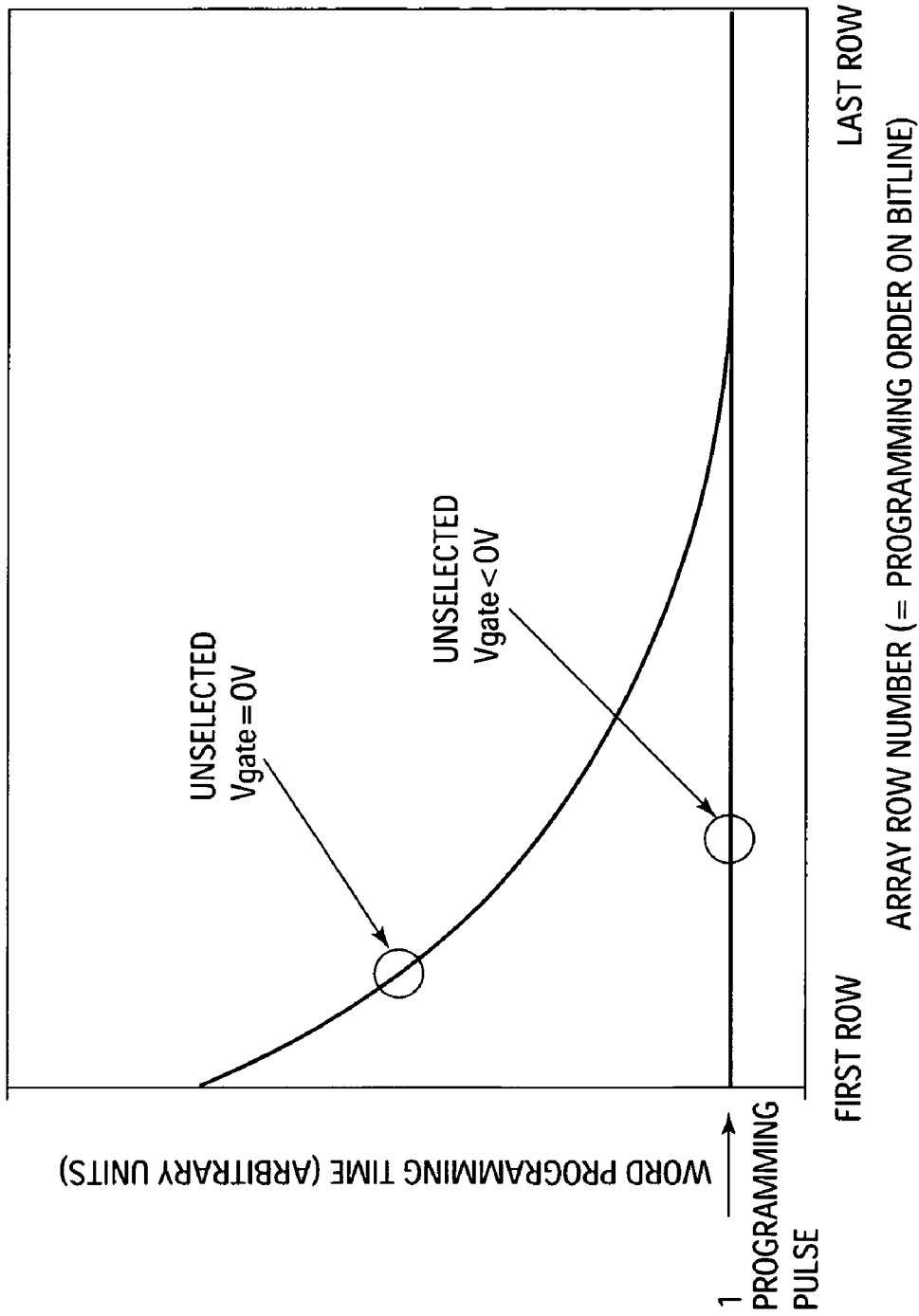
FIG. 4 shows a plot of array row number versus word programming time for prior art programming versus the more efficient programming operation of the present invention.

FIG. 4 illustrates a plot of the array row number versus the word programming time for both the typical prior art programming method as compared to the more efficient programming method of the present invention. This graph shows programming time as one cell at a time is programmed down a bitline of a NOR flash memory array. Programming a cell places a negative charge on the floating gate of the programmed cell. This stored negative charge is comparable to the method of the present invention where a negative wordline voltage is applied to an unprogrammed cell on the bitline. Both produce a similar vertical electric field on the cells that reduces the cell's leakage current. This graph demonstrates that as cells are programmed one-by-one, the programming efficiency increases (i.e., programming time decreases). Ultimately, the graph saturates at a programming time equivalent to the minimum time required by the flash design to apply one program pulse.

Figure 5:
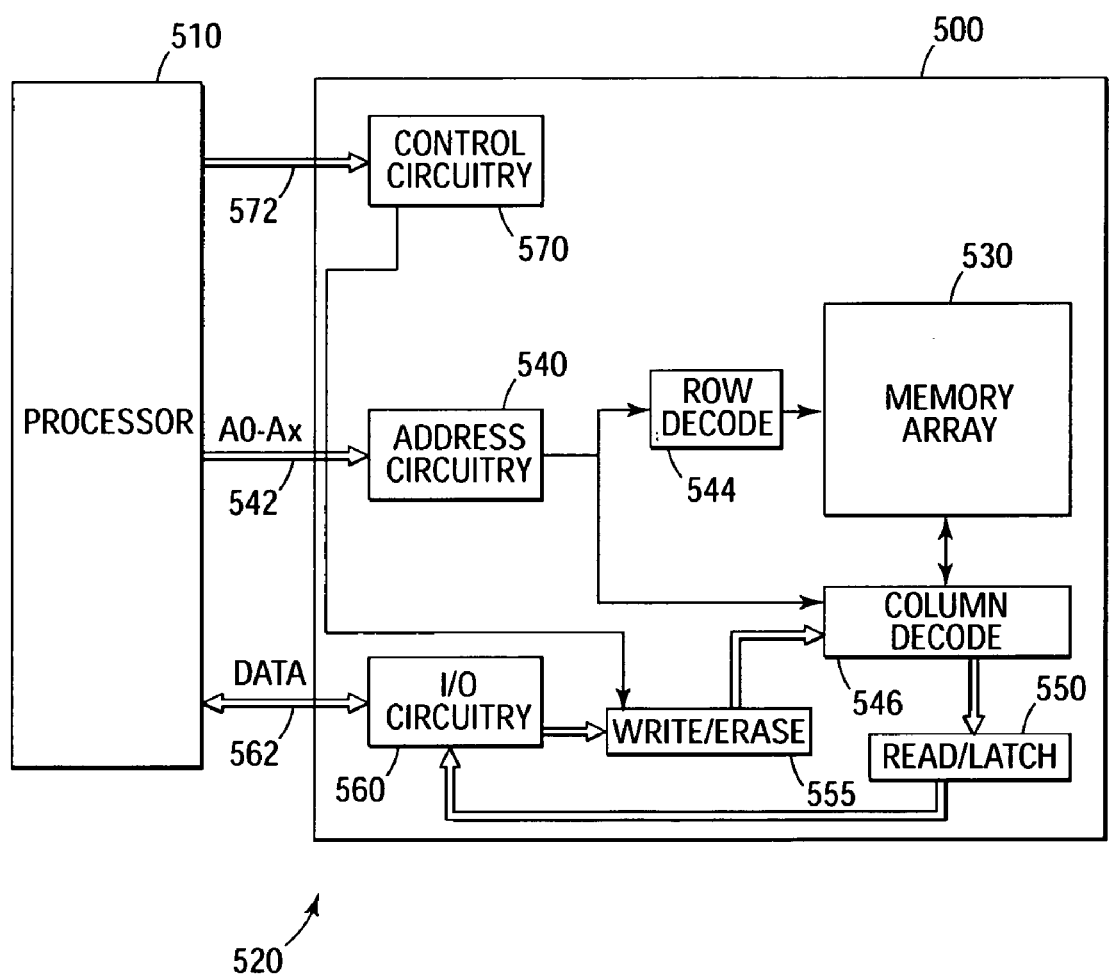
FIG. 5 shows a block diagram of an electronic system of the present invention.

FIG. 5 illustrates a functional block diagram of a memory device 500 that can incorporate the flash memory cells of the present invention. The memory device 500 is coupled to a processor 510. The processor 510 may be a microprocessor or some other type of controlling circuitry. The memory device 500 and the processor 510 form part of an electronic system 520. The memory device 500 has been simplified to focus on features of the memory that are helpful in understanding the present invention.

The memory device includes an array of the flash memory cells 530 that can be flash memory cells incorporating metal floating gates and high-k inter-gate dielectrics formed by low temperature oxidation of metals. The memory array 530 is arranged in banks of rows and columns. The control gates of each row of memory cells is coupled with a wordline while the drain and source connections of the memory cells are coupled to bitlines. As is well known in the art, the connection of the cells to the bitlines depends on whether the array is a NAND architecture or a NOR architecture.

An address buffer circuit 540 is provided to latch address signals provided on address input connections A0–Ax 542. Address signals are received and decoded by a row decoder 544 and a column decoder 546 to access the memory array 530. It will be appreciated by those skilled in the art, with the benefit of the present description, that the number of address input connections depends on the density and architecture of the memory array 530. That is, the number of addresses increases with both increased memory cell counts and increased bank and block counts.

The memory device 500 reads data in the memory array 530 by sensing voltage or current changes in the memory array columns using sense/buffer circuitry 550. The sense/buffer circuitry, in one embodiment, is coupled to read and latch a row of data from the memory array 530. Data input and output buffer circuitry 560 is included for bi-directional data communication over a plurality of data connections 562 with the controller 510. Write circuitry 555 is provided to write data to the memory array.

Control circuitry 570 decodes signals provided on control connections 572 from the processor 510. These signals are used to control the operations on the memory array 530, including data read, data write, and erase operations. The control circuitry 570 may be a state machine, a sequencer, or some other type of controller. In one embodiment, the embodiments of the method of the present invention are executed by the control circuitry 570.

The flash memory device illustrated in FIG. 5 has been simplified to facilitate a basic understanding of the features of the memory. A more detailed understanding of internal circuitry and functions of flash memories are known to those skilled in the art.

CONCLUSION

In summary, the method of the present invention for programming a flash memory device reduces the leakage currents for unselected cells on the same bitline as a programmed cell. This reduces overall current draw from the bitline charge pump and also reduces voltage drop in the bitline path from the additional IR drop. As programming efficiency is proportional to bitline voltage applied, less voltage drop equates to higher programming efficiency.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A flash memory device comprising:
   a memory array having a plurality of flash memory cells organized in rows and columns, each column comprising a bitline coupling drain connections of the plurality of flash memory cells and each row comprising a wordline coupling control gates of the plurality of flash memory cells; and
   control circuitry adapted to perform a programming operation on the memory array, the programming operation comprising:
      pulsing the bitline, coupled to a flash memory cell to be programmed, with a programming pulse having a first predetermined voltage;
      biasing a selected wordline, coupled to the flash memory cell to be programmed, to a second predetermined voltage; and
      biasing unselected wordlines to a predetermined negative voltage.

2. The device of claim 1 wherein the control circuitry is further adapted to perform a program verify operation that comprises biasing the unselected wordlines to ground potential.

3. The device of claim 1 and further including row and column decoders to generate the wordline and bitline, respectively.

4. The device of claim 1 wherein the predetermined negative voltage is substantially in a range of −0.1 to −8V.

5. The device of claim 1 wherein the first predetermined voltage is substantially in a range of 3–6V.

6. The device of claim 1 wherein the second predetermined voltage is substantially in a range of 6–12V.

7. The device of claim 1 wherein the control circuitry is further adapted to verify the programmed flash memory cell.

8. The device of claim 7 wherein verifying comprises returning the unselected wordlines from the predetermined negative voltage to a ground potential.

9. The device of claim 1 wherein the memory array is connected in a NOR architecture.

10. A non-volatile memory device comprising:
    a memory array having a plurality of non-volatile memory cells organized in rows and columns, each column comprising a bitline and each row comprising a wordline; and
    control circuitry adapted to perform a programming operation on the memory array, the programming operation comprising:
       pulsing the bitline, coupled to a non-volatile memory cell to be programmed, with a programming pulse having a first positive voltage;
       biasing a selected wordline, coupled to the non-volatile memory cell to be programmed, to a second positive voltage; and
       biasing unselected wordlines to a predetermined negative voltage.

11. The device of claim 10 wherein the control circuitry is further adapted to verify the programmed non-volatile memory cell by returning the unselected wordlines from the predetermined negative voltage to a ground potential.

12. The device of claim 10 and further including row and column decode circuitry.

13. An electronic system comprising:
a processor that generates memory control signals; and
a flash memory device coupled to the processor and operating in response to the control signals, the flash memory device comprising:
a memory array having a plurality of flash memory cells organized in rows and columns, each column comprising a bitline and each row comprising a wordline; and
control circuitry adapted to perform a programming operation on the memory array, the programming operation comprising:
pulsing the bitline, coupled to a flash memory cell to be programmed, with a programming pulse having a first predetermined voltage;
biasing a selected wordline, coupled to the flash memory cell to be programmed, to a second predetermined voltage; and
biasing unselected wordlines to a predetermined negative voltage.

14. The system of claim 10 wherein the control circuitry is further adapted to perform a program verify operation that comprises increasing the predetermined negative voltage to ground potential for a read operation.

15. The system of claim 10 wherein the memory control signals comprise program and read operations.

16. The system of claim 13 wherein the flash memory device is coupled to the processor over address, data and control buses.

17. The system of claim 16 wherein the control circuitry is coupled to the processor over the control bus.

18. The system of claim 13 wherein the flash memory device further includes row and column decoders to generate the wordlines and bitlines, respectively.

19. The system of claim 18 wherein the row and column decoders are coupled to an address bus.

20. The system of claim 13 wherein the predetermined negative voltage is substantially in a range of −0.1 to −8V, the first predetermined voltage is substantially in a range of 3–6V, and the second predetermined voltage is substantially in a range of 6–12V.

* * * * *